US008795503B2

(12) United States Patent
Zahraoui et al.

(10) Patent No.: US 8,795,503 B2
(45) Date of Patent: Aug. 5, 2014

(54) DEVICE AND METHOD TO CONDUCT AN ELECTROCHEMICAL REACTION ON A SURFACE OF A SEMI-CONDUCTOR SUBSTRATE

(75) Inventors: Said Zahraoui, Savigny (FR); Francis Descours, Orsay (FR); Frederic Raynal, Paris (FR)

(73) Assignee: Alchimer, Massy (FR)

( * ) Notice: Subject to any disclaimer, the term of this patent is extended or adjusted under 35 U.S.C. 154(b) by 223 days.

(21) Appl. No.: 13/256,824

(22) PCT Filed: Mar. 25, 2010

(86) PCT No.: PCT/EP2010/053955
§ 371 (c)(1),
(2), (4) Date: Sep. 15, 2011

(87) PCT Pub. No.: WO2010/108996
PCT Pub. Date: Sep. 30, 2010

(65) Prior Publication Data
US 2012/0000785 A1  Jan. 5, 2012

(30) Foreign Application Priority Data
Mar. 27, 2009  (FR) .................................... 09 01518

(51) Int. Cl.
C25D 5/00 (2006.01)
C25D 9/02 (2006.01)
C25D 17/00 (2006.01)
C25D 17/12 (2006.01)
H01L 21/288 (2006.01)
C25D 9/00 (2006.01)
C25D 7/12 (2006.01)

(52) U.S. Cl.
CPC ............... *C25D 5/006* (2013.01); *C25D 7/123* (2013.01); *H01L 21/2885* (2013.01); *C25D 17/001* (2013.01); *C25D 9/00* (2013.01); *C25D 9/02* (2013.01); *Y10S 204/07* (2013.01)
USPC ..... 205/91; 204/230.2; 204/242; 204/DIG. 7; 205/92; 205/157; 205/317

(58) Field of Classification Search
USPC ..................... 205/91, 92; 204/230.2; 118/623
See application file for complete search history.

(56) References Cited

U.S. PATENT DOCUMENTS 4,247,373 A * 1/1981 Shimano et al. .............. 438/384
6,193,860 B1 * 2/2001 Weling ....................... 204/230.2
(Continued)

FOREIGN PATENT DOCUMENTS

| EP | 1117850 | 7/2001 |
| EP | 1678352 | 7/2006 |

(Continued)

OTHER PUBLICATIONS

Search Report dated Oct. 26, 2009, for French Application No. FR0901518.   (Continued)

*Primary Examiner* — James Lin
*Assistant Examiner* — William Leader
(74) *Attorney, Agent, or Firm* — Alston & Bird LLP

(57) ABSTRACT

The invention concerns a device to conduct an electrochemical reaction on the surface of a semiconductor substrate (S), characterized in that the device comprises: a container (10) intended to contain an electrolyte (E), a support (20) arranged in the container, said support being adapted for attachment of the semiconductor substrate (S) on said support (20), a counter-electrode (30) arranged in the container (10), illumination means (50) comprising a source (51) emitting light rays and means (52) to homogenize the light rays on all of said surface of the semiconductor substrate (S), so as to activate the surface of the semiconductor substrate (S), and an electric supply (40) comprising connection means for connection to the semiconductor substrate and to the counter-electrode in order to polarize said surface of said semiconductor substrate (S) at an electric potential permitting the electrochemical reaction. The invention also concerns the method to conduct an electrochemical reaction on a surface of a corresponding semiconductor substrate.

15 Claims, 15 Drawing Sheets

(56) References Cited

U.S. PATENT DOCUMENTS

| | | |
|---|---|---|
| 6,478,944 B1 * | 11/2002 | Ishiyama ..................... 205/102 |
| 6,530,733 B2 | 3/2003 | Klein et al. |
| 6,821,912 B2 | 11/2004 | Klein et al. |
| 7,100,954 B2 | 9/2006 | Klein et al. |
| 2002/0033133 A1 | 3/2002 | Klein et al. |
| 2002/0036146 A1 * | 3/2002 | Akutsu et al. ................ 205/316 |
| 2005/0029123 A1 | 2/2005 | Uzoh et al. |
| 2007/0256937 A1 | 11/2007 | Basker et al. |
| 2008/0003781 A1 | 1/2008 | Woodruff et al. |

FOREIGN PATENT DOCUMENTS

| | | |
|---|---|---|
| JP | 2007/046154 | 2/2007 |
| WO | WO 00/37206 | 6/2000 |
| WO | WO 2007/099218 | 9/2007 |

OTHER PUBLICATIONS

International Search Report dated Jul. 5, 2010 for Application No. PCT/EP2010/053955.

Chazalviel, "The Silicon/Electrolyte Interface," *Porous Silicon Science and Technology*, 1995, pp. 17-32, Vial and Dierrien Eds. Springer, Berlin.

* cited by examiner

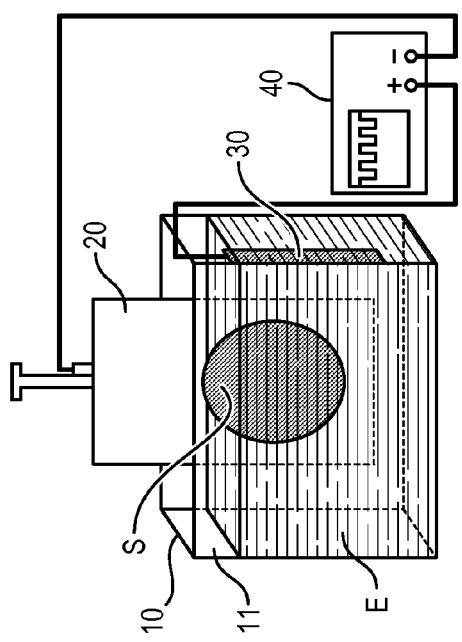
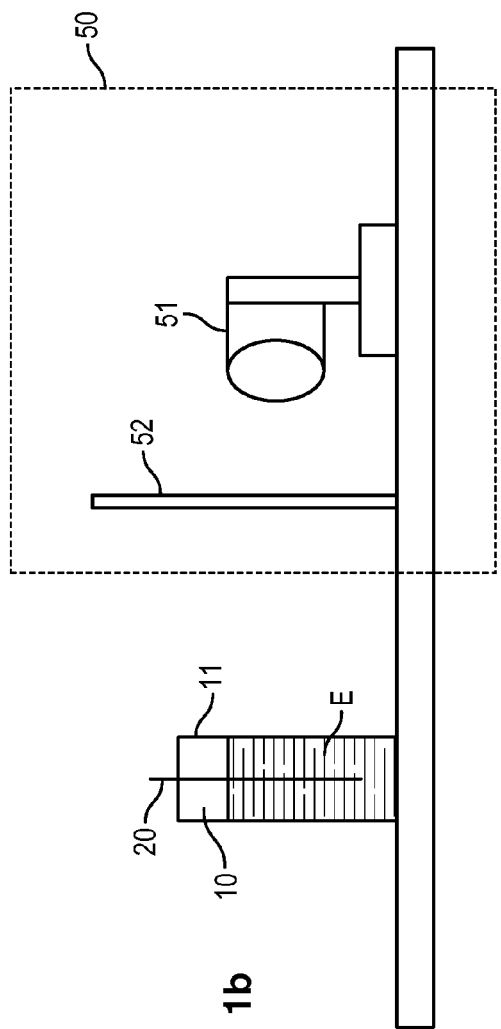
FIG. 1a
FIG. 1b

DEVICE AND METHOD TO CONDUCT AN ELECTROCHEMICAL REACTION ON A SURFACE OF A SEMI-CONDUCTOR SUBSTRATE

CROSS REFERENCE TO RELATED APPLICATIONS

This application is a national stage application, filed under 35 U.S.C. §371, of International Application No. PCT/EP2010/053955, filed Mar. 25, 2010, which claims priority to French Application No. 0901518, filed Mar. 27, 2009, both of which are hereby incorporated by reference in their entirety.

FIELD OF THE INVENTION

The present invention concerns electrochemistry on semiconductor substrates.

More precisely, it relates to a device and method to perform an electrochemical reaction on a surface of semiconductor substrate.

TECHNICAL BACKGROUND

The conducting of electrochemical reactions on a surface of a semiconductor substrate is known.

Conventionally, the semiconductor substrate and a counter-electrode are immersed in an electrolyte containing a species able to react on the surface of said substrate.

The surface of the substrate is then polarized using an electric power source at a potential permitting the envisaged reaction.

Depending on whether the envisaged reaction is anodic or cathodic, and depending on the type of conductivity—N or P—of the semiconductor substrate, it may be necessary to activate the reaction by illuminating the semiconductor substrate.

The aim of illumination is to excite the charge carriers of the semiconductor valence band to populate the conduction band, which corresponds to what is called activation of the surface of the semiconductor substrate.

If illumination provides energy that is greater than the difference between the valence and conduction bands—i.e. the gap—of the semiconductor, the charge carriers are able to take part in electrochemical reactions.

The conducting of such anodic or cathodic reactions has been subject of numerous patent applications and scientific publications.

Amongst the most known reactions, mention may be made of reactions concerning the porosification of silicon on n- or p-doped substrates, these reactions being mostly conducted in a hydrofluoric acid medium such as described in J. N. Chazalviel, "*Porous Silicon Science and Technology*", Vial and Derrien Eds. Springer, Berlin 1995, 17-32.

One well-known electrochemical reaction on the surface of a semiconductor substrate is the grafting of organic molecules and polymers. Amongst these the following can be cited:
- the grafting of methoxy groups from methanol;
- electrochemical grafting reactions of alkyl groups via radicals formed anodically from organomagnesium compounds of RMgX type, or via radicals formed cathodically from alkane halides of RX type;
- the grafting of phenyl groups from diazonium salts;
- the grafting of vinyl polymers from diazonium salts;
- the grafting of polymers from unsaturated organomagnesium compounds of RMgX type.

The devices used to conduct such reactions generally comprise a tank to contact the substrate with the electrolyte, a counter-electrode and a light source.

Said devices have disadvantages however:
- they do not permit uniform illumination of the surface of the substrate, the reaction is therefore not conducted uniformly;
- no known device allows the conducting of electrochemical reactions activated by illumination on a substrate surface of greater size than a disc 50 mm in diameter;
- no device permits uniform illumination of the semiconductor substrate without substantially perturbing the electric field lines in the electrolyte between the substrate and the counter-electrode.

As a general rule, the notion of uniformity for said electrochemical reactions on the surface of semiconductor substrates, such as used in the microelectronics industry, is not described in any prior art document.

The descriptions of prior art devices remain very brief and only allow reactions to be considered on the scale of substrates having a size of a few $cm^2$.

SUMMARY OF THE INVENTION

The invention proposes remedying at least one of these drawbacks.

To this end, the invention according to a first aspect proposes a device to conduct an electrochemical reaction on a surface of a semiconductor substrate, the device comprising:
- a container intended to contain an electrolyte,
- a support arranged in the container, said support being adapted to attach the semiconductor substrate onto said support,
- a counter-electrode arranged in the container,
- illumination means comprising a source emitting light rays and means to homogenize the light rays over the entire said surface of the semiconductor substrate, so as to activate the surface of the semiconductor substrate, and
- an electric power source comprising connection means to the semiconductor substrate and to the counter-electrode to polarize said surface of said semiconductor substrate at an electric potential permitting the electrochemical reaction.

The device according to the first aspect of the invention is advantageously completed by the following characteristics, taken alone or in any technically possible combination:
- the container and the support are adapted to receive a substrate in the shape of a disc of given diameter, of between 50 mm and 450 mm;
- the container comprises at least one inner reflective wall reflecting the light radiation from the illumination means;
- the counter-electrode has symmetry about an axis of symmetry, the container and the support being adapted to receive a semiconductor substrate having symmetry about an axis, the support being adapted to fix the semiconductor substrate so that the axis of symmetry of the semiconductor substrate is aligned with the axis of symmetry of the counter-electrode;
- the means to homogenize the light rays over the entire said surface of the semiconductor substrate comprises means to set the semiconductor substrate in rotation about an axis;
- the device further comprises a hydrodynamic diffuser comprising two faces, said hydrodynamic diffuser being arranged in the container with a first face facing the counter-electrode, the support being adapted to fix the substrate facing the second face of the hydrodynamic diffuser;

the hydrodynamic diffuser is formed in a material transparent to the light rays from the illumination means;

the counter-electrode is arranged between the illumination means and the support, the counter-electrode having a shape adapted to allow the passing of at least part of the radiation emitted by the illumination means in the direction of the semiconductor substrate;

the illumination means are arranged in the container;

the illumination means are arranged in the container between the hydrodynamic diffuser and the counter-electrode;

the illumination means are arranged on the hydrodynamic diffuser;

the container comprises an outer side wall transparent to the light radiation from the illumination means, the illumination means being arranged outside the container in the vicinity of the side wall;

the counter-electrode is ring-shaped having a central opening, the illumination means being arranged so as to emit light radiation through the central opening of the counter-electrode;

the illumination means are arranged co-axially to the ring-shaped counter-electrode, substantially inside the central opening of the counter-electrode;

the illumination means comprise a plurality of light sources arranged in the container to emit homogeneously distributed light radiation over the surface of the semiconductor substrate;

the illumination means comprise a structure comprising a surface having a central opening, the counter-electrode being arranged co-axially to the central opening, the light sources being distributed over the surface of the structure on the periphery of the central opening;

the counter-electrode is arranged inside the central opening of the structure of the illumination means;

the illumination means comprise a structure comprising a surface, the counter-electrode being fixed to the surface of the structure, the light sources being distributed over the surface of the structure on the periphery of the counter-electrode;

the means to homogenize the light rays from the illumination means comprise deflectors adapted to distribute the light radiation from the light sources homogeneously over the surface of the semiconductor substrate;

the light source is arranged on the support, and the light source is oriented so as to emit light rays in the direction of the counter-electrode, the counter-electrode being in material reflecting the light rays from the source.

The invention, according to a second aspect, also proposes a method to conduct an electrochemical reaction on a surface of a semiconductor substrate, the method comprising the steps of:

contacting the semiconductor substrate with an electrolyte, emitting a light radiation in the direction of said surface of the semiconductor substrate, homogenizing the light radiation emitted over the entire said surface of the semiconductor substrate (S), so as to activate the surface of the semiconductor substrate, and polarizing said surface of said semiconductor substrate at an electric potential permitting the electrochemical reaction.

The method according to the second aspect of the invention is advantageously completed by the following characteristics, taken alone or in any technically possible combination:

the electrolyte contains an electrochemically active species, the electrochemical reaction involving said species;

a substrate is used that is disc-shaped with a given diameter of between 50 mm and 450 mm;

the species is metallic, so that the electrochemical reaction leads to formation of a metal film on the surface of the substrate, and the species is organic, so that the electrochemical reaction leads to formation of an organic film on the surface of the substrate.

The invention, according to a third aspect, also concerns semiconductor substrate coated with a metal film obtained using the method according to the second aspect of the invention.

According to a fourth aspect, the invention further concerns a semiconductor substrate coated with an organic film obtained using the method according to the second aspect of the invention.

The invention provides numerous advantages.

The device according to the first aspect of the invention permits uniform illumination of a surface of a semiconductor substrate notably via specific homogenization means, for the purpose of achieving a uniform electrochemical reaction. The device according to the first aspect of the invention also permits this uniform lighting whilst guaranteeing scarcely perturbed field lines between the semiconductor substrate and the counter-electrode.

The invention also allows the performing of said reaction on a surface of a large-size substrate, in particular greater than that of a disc 50 mm in diameter.

BRIEF DESCRIPTION OF THE DRAWINGS

Other characteristics, purposes and advantages of the invention will become apparent from the following description, which is solely illustrative and non-limiting, and is to be read with reference to the appended drawings in which:

FIGS. 1a and 1b are schematics of part of the device according to one embodiment of the invention;

In the different figures, similar parts carry the same reference numbers.

DETAILED DESCRIPTION

Figure 2A:
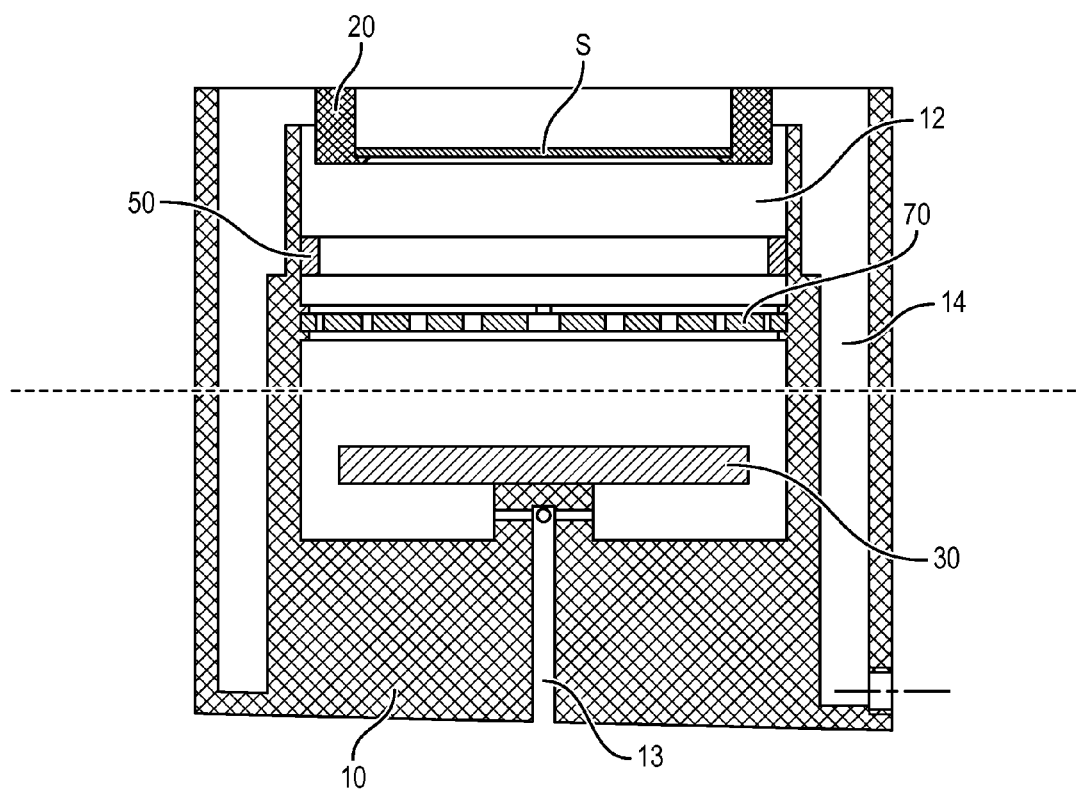
FIGS. 2a to 2d are front-view or underside cross-sectional views of part of the device according to embodiments of the invention, in which the illumination means are arranged in the container and the device comprises a hydrodynamic diffuser.

Under the invention, two categories of electrochemical reactions are considered: natural reactions and forced reactions.

By natural reaction is meant an electrochemical reaction in which electric conduction is ensured by majority charge carriers in the substrate.

Natural reactions are cathodic reactions on the surface of a substrate of N-conductivity, and the anode reactions occur on the surface of a substrate of P-conductivity.

For natural reactions, illumination has a catalyst effect on the reaction.

By forced reaction is meant an electrochemical reaction in which electric conduction is ensured by the minority charge carriers in the substrate.

Forced reactions are cathodic reactions on the surface of a substrate of P-conductivity, and the anode reactions on the surface of a substrate of N-conductivity.

For forced reactions, illumination is necessary to activate the reaction.

With reference to FIGS. 1a and 1b, a device according to a first possible embodiment of the first aspect of the invention comprises a container 10, and a support 20 and counter-electrode 30 arranged in the container.

The support is adapted for attaching the substrate S onto the support 20. The container 10 is intended to contain an electrolyte E to ensure electric conduction between the substrate S and the counter-electrode.

Preferably, but not limited thereto, the electrolyte E contains an electrochemically active species i.e. a species able to react on the surface of the substrate S under particular electric potential conditions. It is simply designated as "the species" in the remainder hereof.

The species is preferably chosen in relation to the reaction it is desired to conduct.

The container 10 therefore permits contacting of the substrate S with the electrolyte E containing the species.

The envisaged reaction can also not have any recourse to an electrolyte species, and solely concern a constituent of the surface of the substrate S.

The device also comprises illumination means 50 comprising a source 51 emitting light rays and means 52 to homogenize the light rays over all said surface of the semiconductor substrate S, so as to activate said surface.

Under the invention, "to activate a surface of a semiconductor substrate" means to populate its conduction band with charge carriers derived from its valence band.

The device further comprises an electric power supply 40 comprising means for connection to the substrate S and to the counter-electrode 30 to polarize said surface of the semiconductor substrate S at an electric potential permitting the desired electrochemical reaction.

The uniformity of the electrochemical reaction on the surface of the substrate S depends on the uniformity of illumination of the surface and on the electric potential applied, in particular on the electric field lines between the substrate S and the counter-electrode 30.

The illumination means 50 and the counter-electrode 30 should therefore be arranged so as to obtain the best compromise between homogeneity of light radiation in the direction of the substrate and homogeneity of the electric field lines between the substrate S and the counter-electrode 30.

According to the first embodiment of the device shown in FIGS. 1a and 1b, the source 51 is located outside the container 10, directed towards the substrate.

With reference to FIG. 1b, the means 52 to homogenize the light rays comprise a light diffusing shield arranged between the source 51 and the container 10, so as to diffuse the rays emitted by the source as homogeneous light radiation in the direction of the surface of the substrate S. The container then comprises an outer wall 11 transparent to the homogeneous light radiation.

Under the invention, by object "transparent to a light ray" is meant an object which allows the light ray to pass, at least in part.

For example, the object can be fully transparent and allow the entirety of the light ray to pass, or it can reflect or partly absorb the light ray.

The object can also be translucent to the light ray, in which case the light ray is diffused by the object.

It will be designated similar to an object "transparent to a light ray". Specifically in this embodiment, the container 10—as an illustrative example but not limited thereto—can be a parallelepiped tank in glass. As shown in FIG. 1a, the counter-electrode 30 is then offset from the pathway of the homogeneous light radiation directed towards the substrate S. In this manner the uniform illumination of the substrate S is not disturbed by the counter-electrode.

Advantageously, the illumination means 50 comprise means (not shown) to set the source 51 in movement.

The means setting in movement can allow rotation of the source 51 about an axis, or scanning of the surface of the substrate S for improved uniformity of illumination.

In general, the means 52 to homogenize the light rays advantageously comprise an object translucent to the light rays emitted by the source 51, arranged between the source 51 and the support 20, so as to diffuse the light rays as homogeneous light radiation towards the surface of the substrate S.

Owing to the off-setting of the counter-electrode, the electric field lines are not homogeneous; in particular they are dissymmetric. The counter-electrode 30 is preferably positioned so that the electric field lines are as homogeneous as possible, outside the pathway of the homogeneous radiation directed towards the substrate S.

Generally, the container 10 and the support 20 are advantageously adapted to receive a disc-shaped substrate of given diameter. Preferably, the given diameter lies between 50 mm and 450 mm.

Also in general, the container 10 advantageously comprises at least one inner wall reflective to light radiation from the illumination means 50. The light radiation is therefore reflected by inner walls of the container, which improves the homogeneity of radiation directed towards the surface of the substrate S, and hence the uniformity of illumination.

Under the invention, by object or material "reflective to light rays" is meant any object or material having a reflection coefficient to normal incidence equal to or more than 0.8 for these rays.

Preferably, but not limited thereto, all the inner walls of the container 10 are reflective to the light radiation from the illumination means 50.

In particular, in this embodiment of the device according to the first aspect of the invention, the wall 11 is preferably transparent to the outside and reflective on the inside to the light radiation. As a non-limiting example, the wall 11 may comprise a tin-free mirror directed towards the inside of the container.

To ensure good homogeneity of the field lines, advantageously a substrate S is used and a counter-electrode 30 each having symmetry about an axis, the substrate S and the counter-electrode being arranged facing or substantially facing one another as illustrated in FIGS. 2a to 9.

Therefore, the counter-electrode 30 advantageously has symmetry about an axis of symmetry, the container 10 and the support 20 are adapted to receive a substrate S having symmetry about an axis, and the support 20 is adapted to fix the substrate S so that the axis of symmetry of the substrate S is aligned with the axis of symmetry of the counter-electrode 30.

According to a second embodiment of the device under the first aspect of the invention illustrated in FIGS. 2a to 2d, the counter-electrode 30 and the substrate S are disc-shaped.

The container in this embodiment is of fountain cell type, known to the person skilled in the art.

The counter-electrode 30 is arranged at the bottom of a main tank 12 of the container 10, at the top of which the support 20 is positioned to attach the substrate S.

A duct 13 allows the supply of electrolyte 4 via the bottom part of the tank 12, a secondary tank 14 being intended to receive the electrolyte E which overflows at the top of the main tank 12. The secondary tank 14 is arranged so as to surround the main tank 12, thereby forming a double-walled container 10.

The substrate S and the counter-electrode are arranged horizontally i.e. in a normal position for circulation of the electrolyte E.

Preferably, but not limited thereto, the container 10 has substantially axial symmetry.

Generally, the device according to the first aspect of the invention advantageously comprises a liquid pump to ensure circulation of the electrolyte E.

Specifically in this embodiment, the liquid pump (not shown) ensures circulation of the electrolyte E perpendicular to the counter-electrode 30 and to the substrate S, from tank 12 towards tank 14.

Advantageously the device according to the first aspect of the invention further comprises a hydrodynamic diffuser 70 arranged in the container 10. The diffuser 70 comprises two faces and is arranged in the container 10 with a first face facing the counter-electrode 30, the support 20 being adapted to fix the substrate S facing the second face of the hydrodynamic diffuser 70.

The diffuser 70 generates turbulence in the electrolyte E to perturb the hydrodynamics between the counter-electrode 30 and the substrate S.

In this manner, the flow of electrochemically active species on the surface of the substrate S, on which uniformity of the electrochemical reaction depends, is homogenized. FIG. 2c illustrates an underside cross-section, viewed from the area marked with a dotted line in FIG. 2a, of an exemplary diffuser arranged in the tank. In this example, the diffuser 70 comprises holes to ensure turbulent flow of the electrolyte E conveyed by the duct 13.

In this embodiment, the illuminations means 50 are arranged in the container 10.

Generally, the source 51 comprises a halogen lamp for example, optic fibres, neon, light-emitting diode or any other equivalent means known to the person skilled in the art.

The means 52 to homogenize the light rays may comprise a light diffuser, divergent optic lenses, or any equivalent means.

The means 52 to homogenize the light rays are ring-shaped for example arranged on the source 51, so that the illumination means 50 emit homogeneous light radiation towards the substrate S.

Advantageously, the means 52 to homogenize the light rays comprise means to set the substrate S in rotation about an axis.

Preferably, but not limited thereto, the support 20 is arranged in a mobile fashion in the container 10 to allow rotation of the substrate S about an axis of symmetry, the light source 51 being arranged substantially on this axis of symmetry.

Therefore, the homogeneity of illumination on the surface of the substrate S is further improved.

Figure 2B:
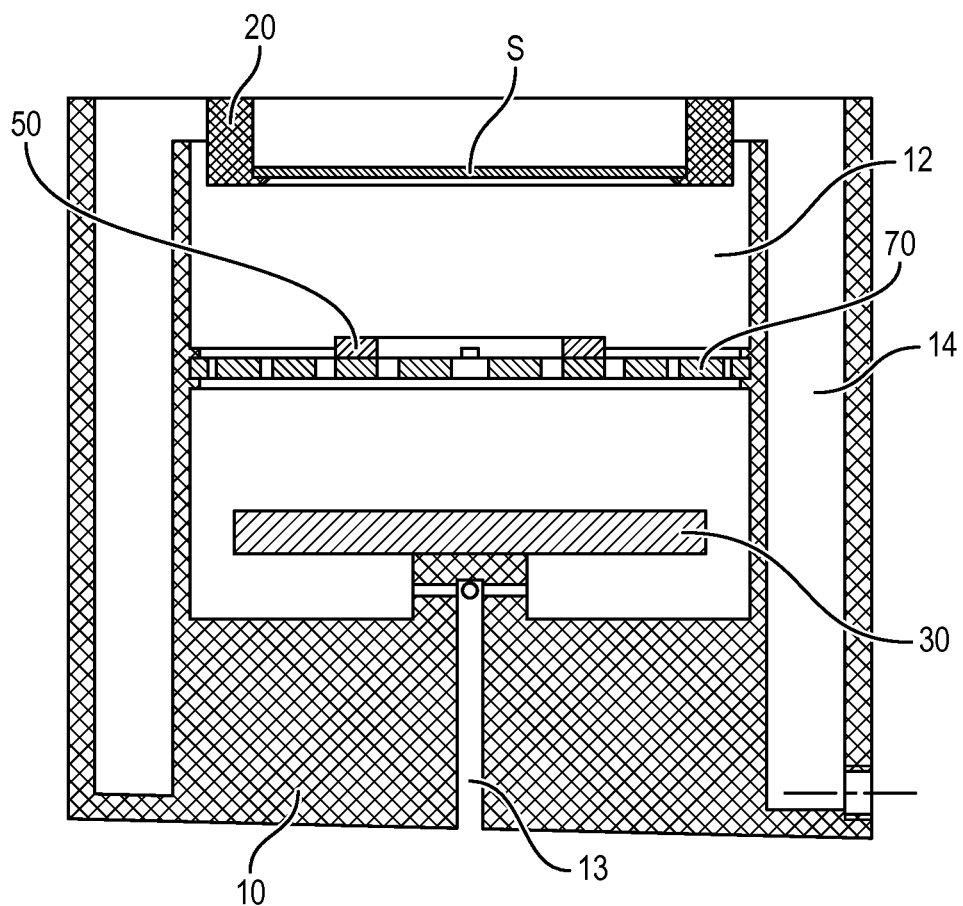
Figure 2C:
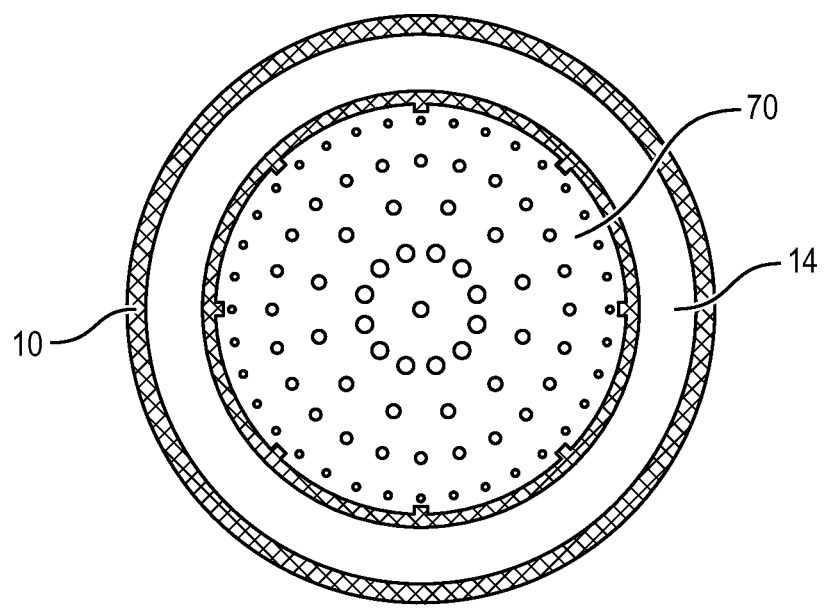

According to a first variant of this embodiment, shown in FIGS. 2a and 2b, the illumination means 50 are arranged between the diffuser 70 and the support 20.

In this way, the homogeneous light radiation is emitted directly towards the substrate S.

The illumination means 50 can be in the form of a light ring arranged on an inner wall of the tank 12, as illustrated in FIG. 2a.

The illumination means 50 can also be arranged on the diffuser 70, preferably facing the substrate.

Advantageously, the illumination means 50 have axial symmetry for improved radiation homogeneity.

Advantageously, the illumination means 50 are arranged on the diffuser 70 so that they do not obstruct the holes and do not perturb the hydrodynamics which promote the electrochemical reaction.

Figure 2D:
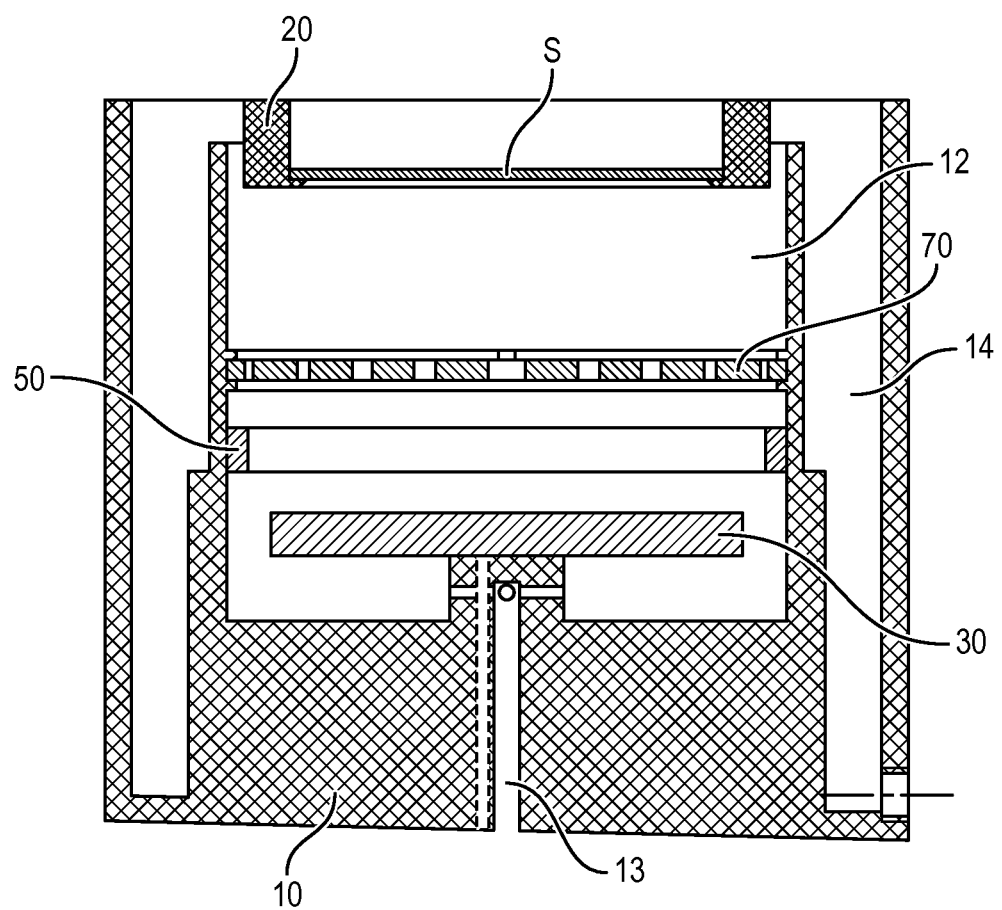

According to a second variant of this embodiment, shown in FIG. 2d, the illumination means 50 are arranged between the counter-electrode 30 and the diffuser 70. The diffuser 70 is then advantageously in material transparent to the light radiation from the illumination means 50.

Figure 3:
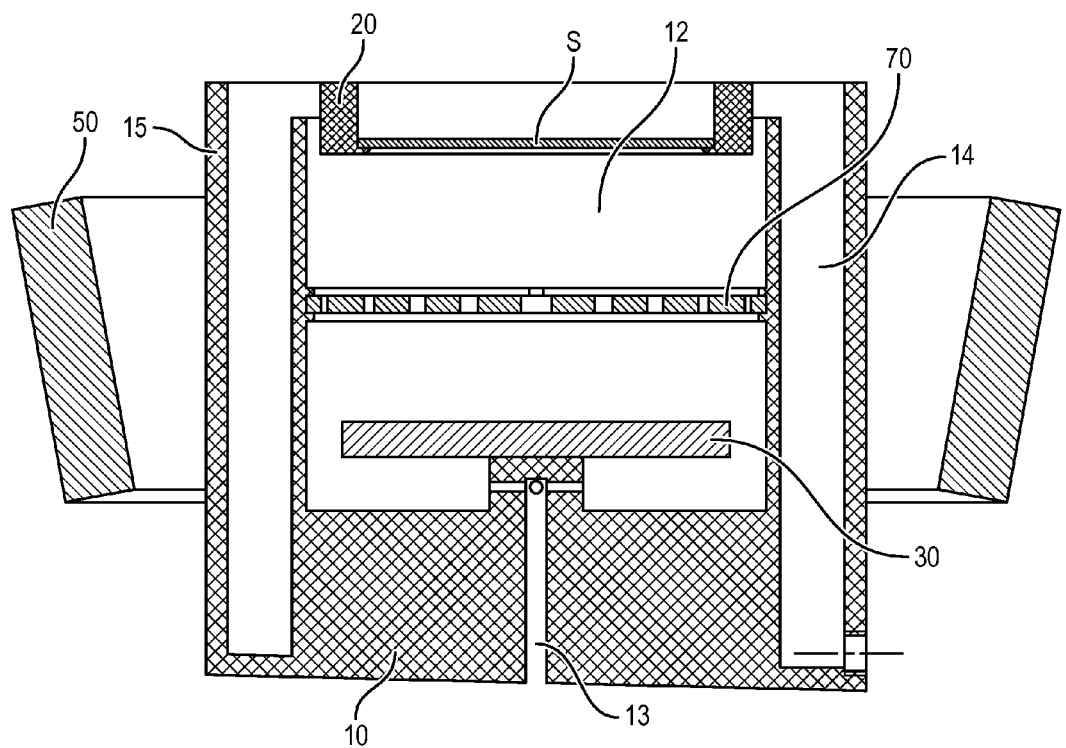
FIG. 3 is a front-view cross-sectional schematic of part of the device according to one embodiment of the invention in which the illumination means are arranged outside the container, in the vicinity of a side wall of the container that is transparent to its light radiation.

With reference to FIG. 3, according to a third embodiment of the device under the first aspect of the invention, the substrate S is illuminated through one or more side walls of the container 10.

The container 10 therefore comprises an outer side wall 15 transparent to the light radiation from the illumination means 50, and the illumination means 50 are arranged outside the container 10 in the vicinity of the wall 15.

In this embodiment, the container is of fountain cell type, and the main tank 12 advantageously has an outer wall transparent to the light radiation from means 15.

Preferably, but not limited thereto, the illumination means 50 are arranged in axial symmetry around the container 10 to ensure light radiation that is homogeneously distributed on the surface of the substrate S.

Figure 4:
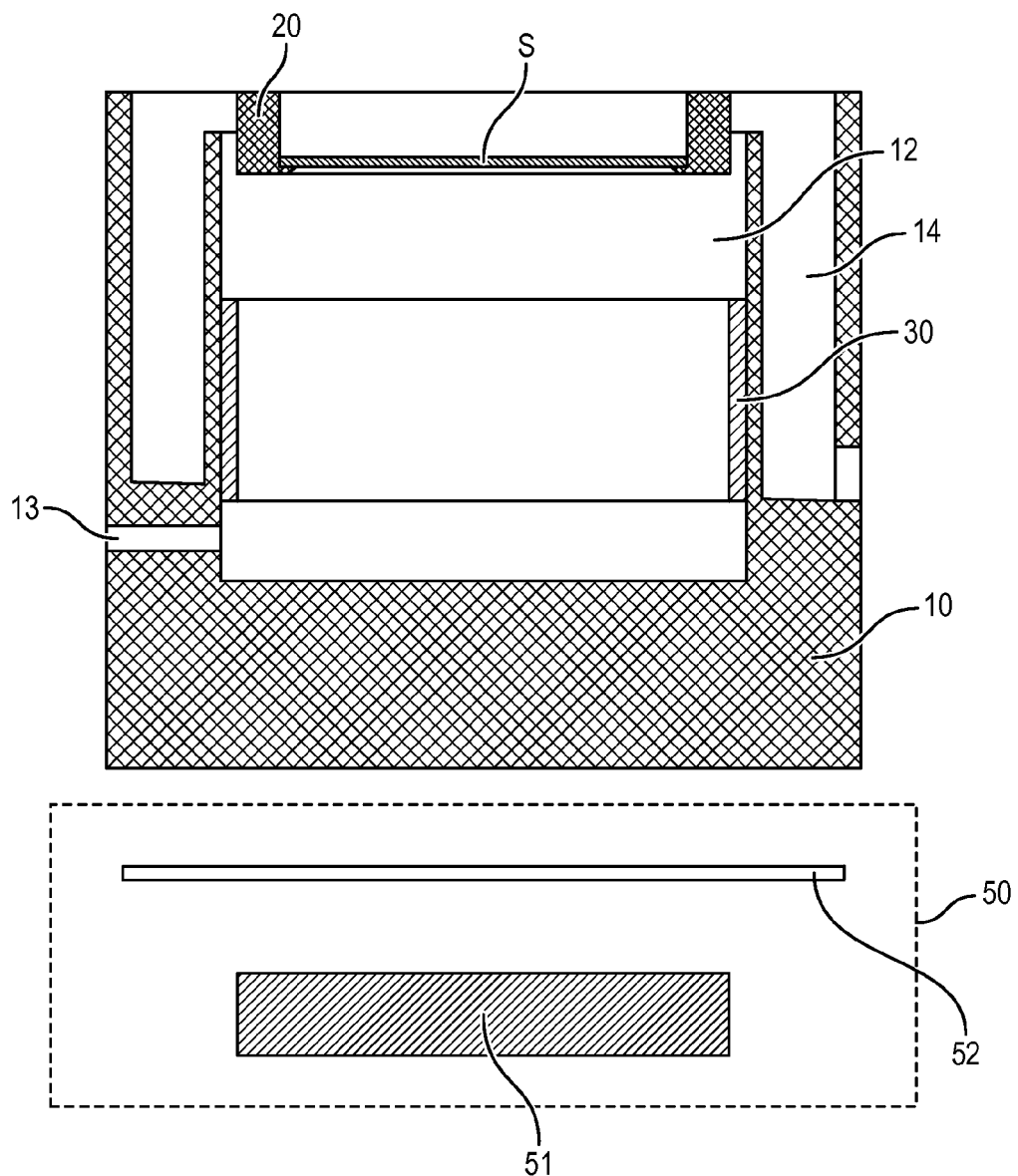
FIG. 4 is a front-view cross-sectional schematic of part of the device according to one embodiment of the invention in which the counter-electrode is arranged between the illumination means and the support.

FIG. 4 depicts a fourth embodiment of the first aspect of the invention, in which the counter-electrode 30 is arranged between the illumination means 50 and the support 20.

The counter-electrode 30 is then advantageously suitably shaped to allow at least part of the light radiation to pass, emitted by the illumination means 50 towards the substrate S.

In this embodiment specifically, the illumination means 50 are arranged outside the container 10 and comprise a source 51 and a light diffusing shield 52 to emit homogeneous light radiation towards the substrate S.

The container 10 is substantially similar to a fountain cell as described above.

An outer wall of the container is in material transparent to the light radiation from the illumination means 50, to allow light to be radiated towards the substrate S.

The duct 13 is off-centred to allow passing of the light radiation.

Preferably, but not limited thereto, the substrate S, the source 51, the diffusing shield 42 and the counter-electrode 30 are aligned.

The counter-electrode 30 is ring-shaped having a central opening allowing the passing of the homogeneous light radiation directed towards the surface of the substrate S.

Figure 5:
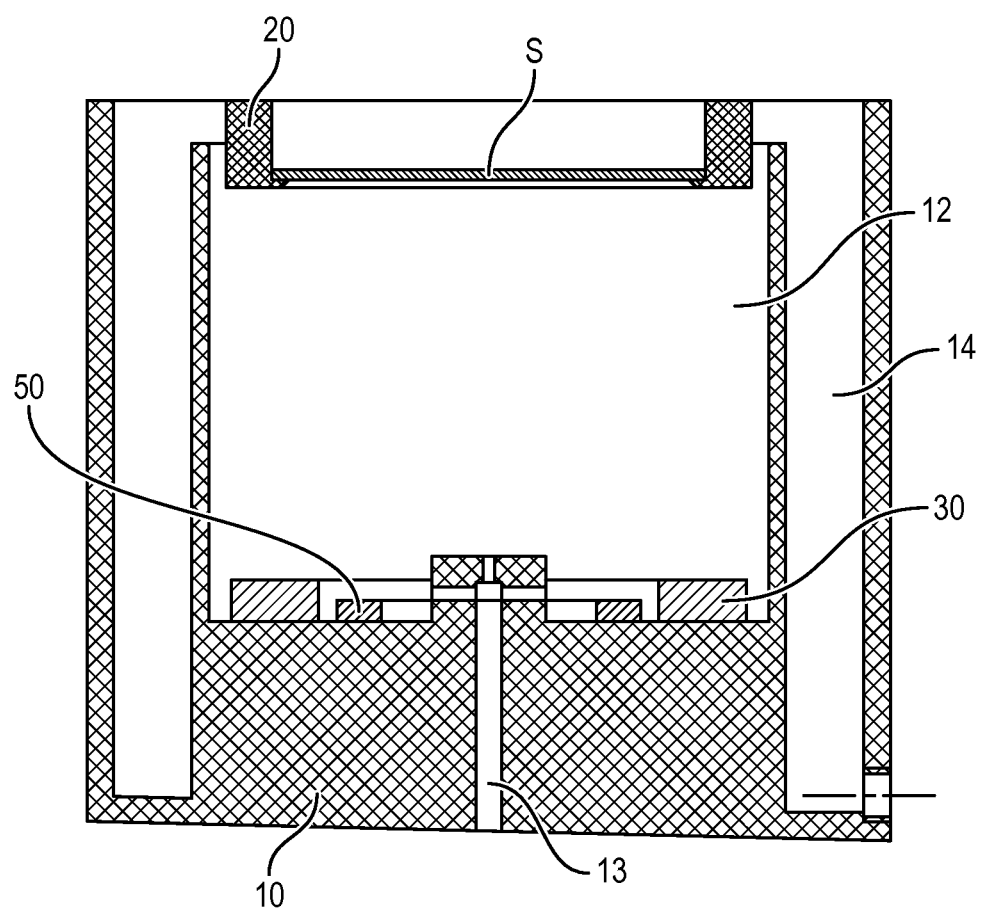
FIG. 5 is a front-view cross-sectional schematic of part of the device according to one embodiment of the invention in which the counter-electrode is ring-shaped, the illumination means being arranged substantially inside the central opening of the counter-electrode.

FIG. 5 depicts a fifth embodiment of the device according to the first aspect of the invention, similar to the fourth embodiment, in which the illumination means 50 are arranged inside the container 10.

The container 10 is of fountain cell type.

The counter-electrode is ring-shaped having a central opening, and the illumination means 50 are arranged so as to emit the light radiation through this central opening.

Advantageously, the illumination means are arranged co-axially to the ring-shaped counter-electrode, substantially inside the central opening of the counter-electrode.

A sixth embodiment of the device according to the first aspect of the invention will now be described with reference to FIGS. 6 to 8b, in which the illumination means 50 comprise a plurality of light sources 53 arranged in the container 10 to emit light radiation distributed homogeneously over the surface of the substrate S.

As a non-limiting example, the light sources 53 may be light-emitting diodes, optic fibres, discharge tubes such as neon lamps or any equivalent means known to the person skilled in the art.

Preferably, but not limited thereto, each light source is associated with one means 52 to homogenize the light rays, for improved homogeneity of light radiation.

The means 52 to homogenize the light rays, associated with each light source 53, for example comprise a lamp in material adapted to diffuse the light rays emitted by the associated source 53.

For example, the illumination means 50 may comprise light-emitting diodes 53 with diverging lenses 52.

Preferably, the light sources are sealed so that they cannot be deteriorated by any contact with the electrolyte E.

Figure 6:
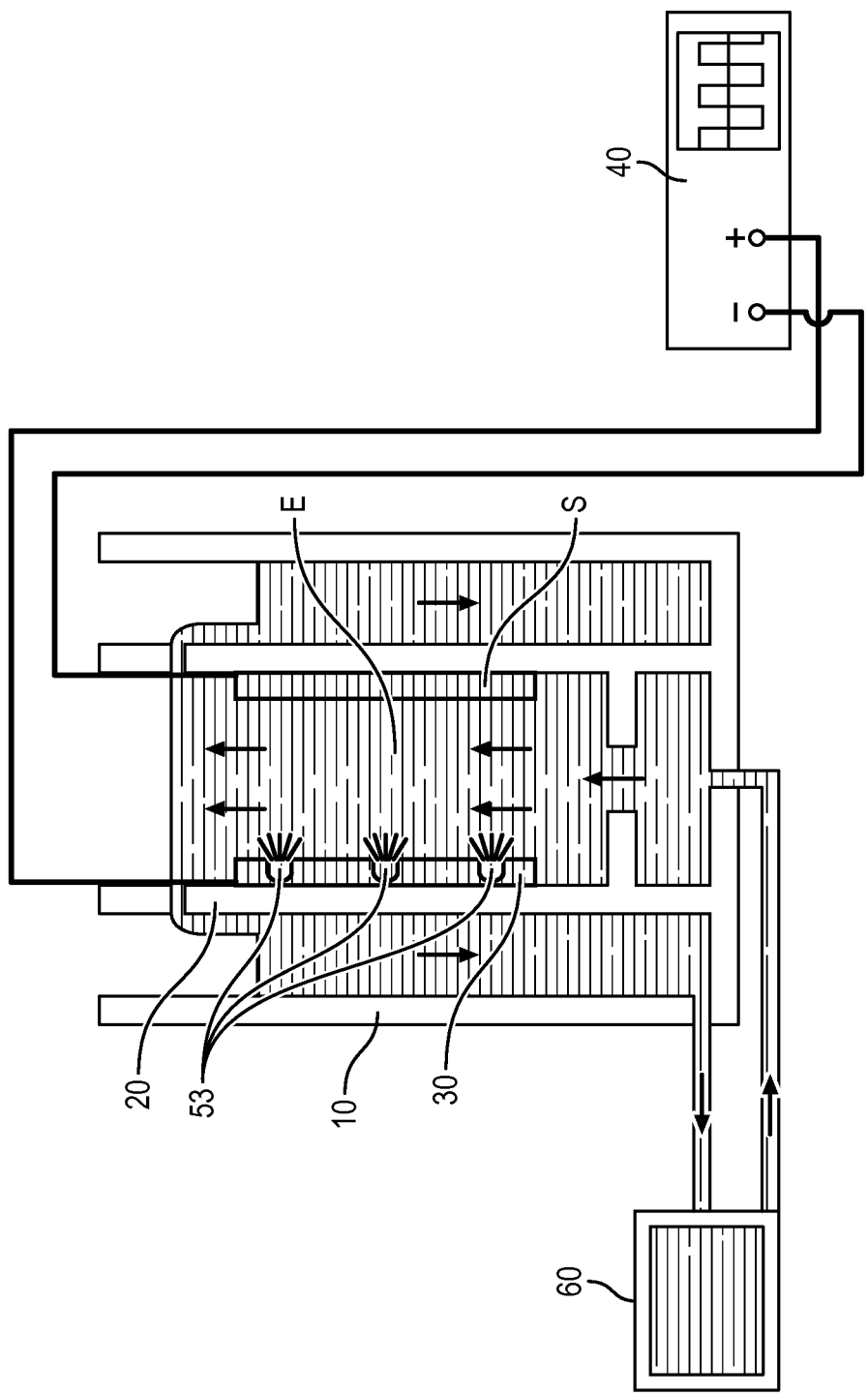
FIG. 6 is a side view schematic of the device according to one embodiment of the invention in which the illumination means comprise a plurality of light sources arranged in the container.

According to one variant of this embodiment illustrated in FIG. 6, the sources 53 are arranged on the counter-electrode 30.

By "arranged on the counter-electrode" is meant that the sources 53 lie flush with a surface of the counter-electrode.

For example, the sources 53 can be arranged on the surface of the counter-electrode.

Alternatively, the sources 53 can be depth integrated in the counter-electrode and protrude on the surface.

In this variant, the container is of vertical fountain cell type, known per se.

The substrate S and the counter-electrode 30 are therefore arranged vertically on the inner walls of the container 10 i.e. in a position tangential to the circulation of electrolyte E.

The support 20 then comprises an inner wall of the container 10.

Preferably, the support S and counter-electrode 30 are arranged facing one another, to ensure good homogeneity of the electric field lines in the electrolyte E.

Advantageously, the device according to this variant comprises a liquid pump 60 to ensure circulation of the electrolyte E in the container.

Figure 7:
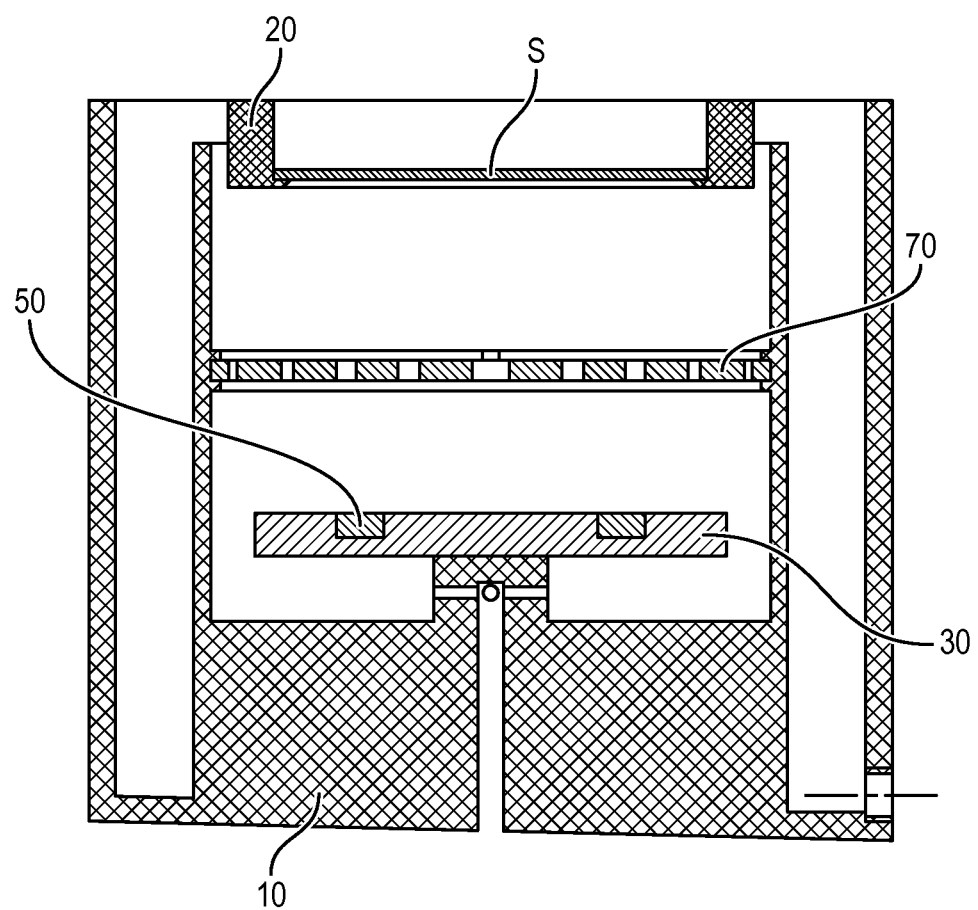
FIG. 7 is a front-view cross-sectional schematic of part of the device according to one embodiment of the invention in which the light sources are arranged on the counter-electrode, the device further comprising a hydrodynamic diffuser.

According to a second variant of this embodiment illustrated in FIG. 7, the container is of fountain cell type.

The illumination means 50 comprise a support on which the sources 53 are arranged, in the shape of a ring with central opening.

The counter-electrode consists of a disc arranged in said central opening and of a ring arranged around said disc.

The device according to this variant advantageously comprises a hydrodynamic diffuser 70 in transparent material.

According to a third embodiment of this embodiment—not shown—the illumination means 50 comprise a structure having a central opening.

The counter-electrode 30 is arranged co-axially to the central opening of said structure, the light sources 53 being distributed over one of the surfaces of the structure on the periphery of the central opening.

Advantageously, the counter-electrode 30 is arranged inside the central opening of said structure.

Figure 8A:
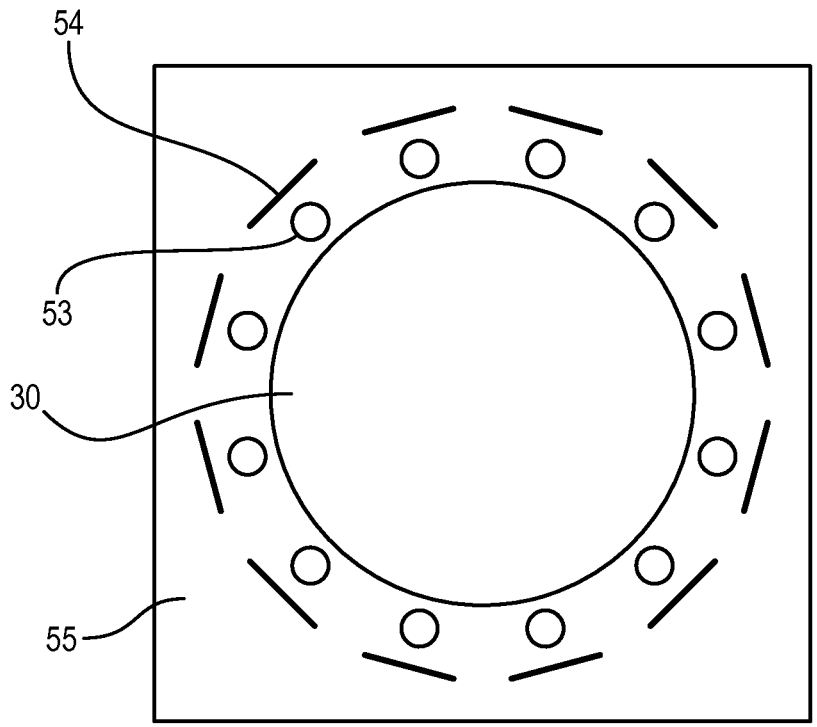
FIGS. 8a and 8b are respective front and side views of part of the device according to one embodiment of the invention in which the light sources are distributed over a surface of a structure on which the counter-electrode is fixed, and on the periphery thereof.

According to a fourth variant of this embodiment shown in FIG. 8a, the illumination means 50 comprise a structure 55 comprising a surface.

The counter-electrode 30 is fixed to the surface of the structure 55 and the light sources 53 are distributed over the surface of the structure on the periphery of the counter-electrode.

Preferably, the surface on which the light sources 53 are distributed faces the substrate S.

Figure 8B:
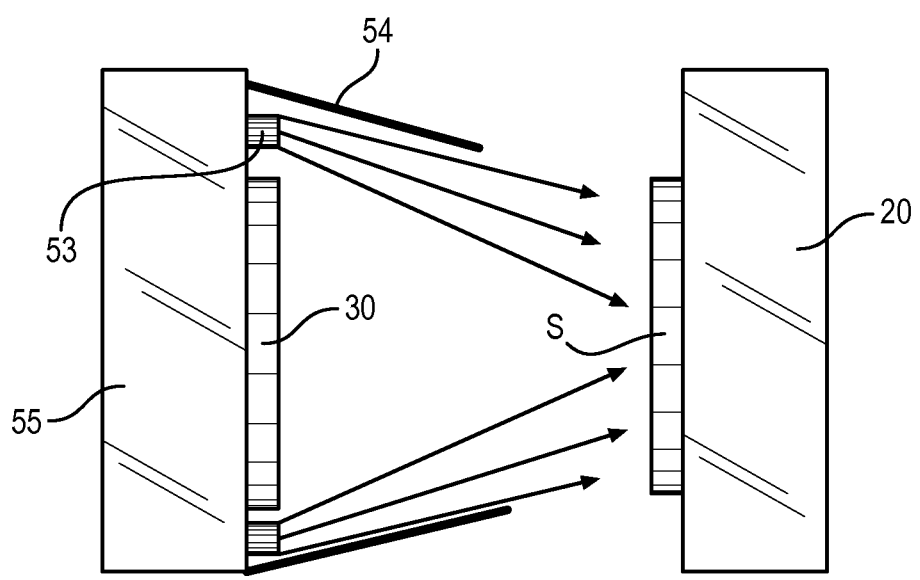

Advantageously, the means 52 to homogenize the light rays comprise deflectors 54 adapted to distribute the light radiation from the light sources 53 homogeneously over the surface of the substrate S, as illustrated in FIG. 8b.

The deflectors 54 may be mirrors for example arranged in the vicinity of the light sources 53 to direct the light rays onto the surface of the substrate S.

Figure 9:
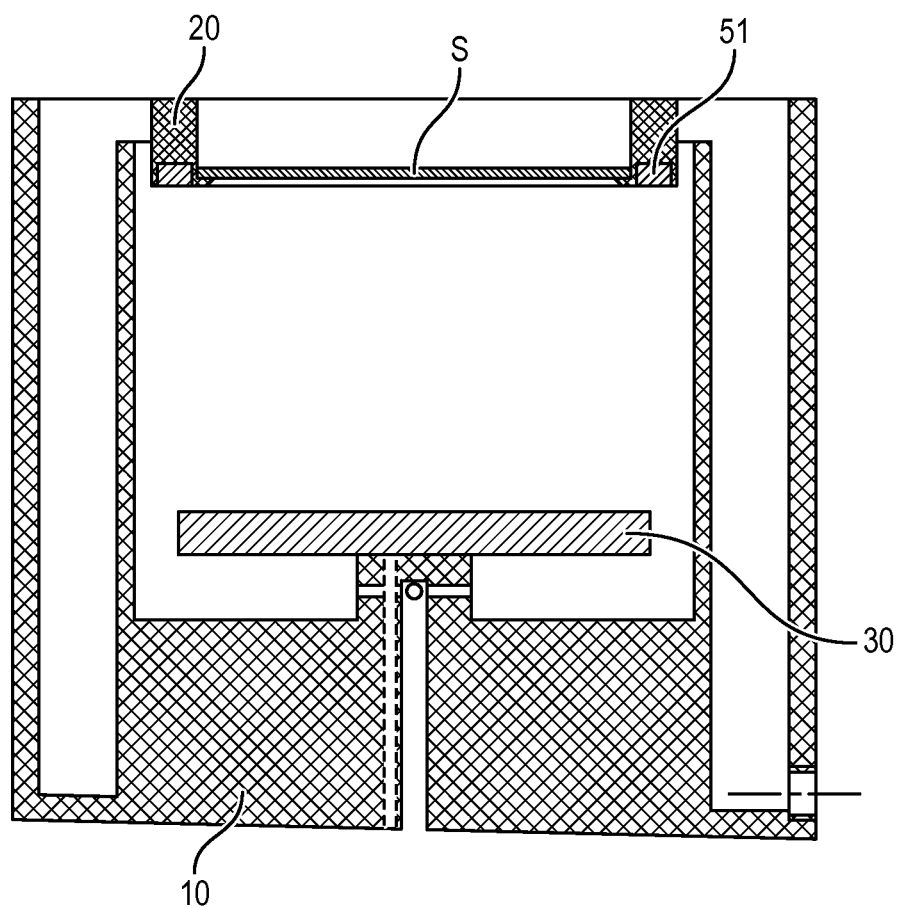
FIG. 9 is a front-view cross-sectional schematic of part of the device according to one embodiment of the invention in which the source is arranged on the support.

A seventh embodiment of the device according to a first aspect of the invention will now be described with reference to FIG. 9, in which the light source 51 is arranged on the support 20.

The container 10 is of fountain cell type.

According to a first variant of this embodiment (not shown) the light source is oriented so as to emit light rays towards one or more inner walls reflective to these rays.

According to a second variant of this embodiment, the light source is oriented so as to emit light rays towards the counter-electrode 30, this counter-electrode being formed in a material reflecting said light rays.

Preferably, the counter-electrode is in metal. The metals which may be suitable for the invention are accessible via any physics/chemistry manual.

The metals which cannot be used as reflective counter-electrode material under the invention are for example diamond-type carbon, germanium, hafnium, manganese, selenium, silicon, tellurium, and zirconium.

Figure 10:
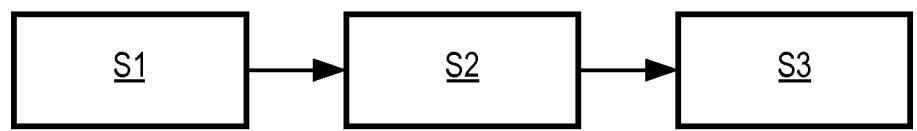
FIG. 10 is a block diagram of the method according to one embodiment of the invention.

The method will now be described according to the second aspect of the invention with reference to FIG. 10.

The method according to the second aspect of the invention comprises a step S1 to contact the substrate S with an electrolyte E.

Advantageously, the electrolyte E comprises an electrochemically active species able to react on the surface of the substrate S under particular electric potential conditions.

Therefore, under the invention, reduction and oxidization electrochemical reactions are envisaged of an electrochemically active species on the surface of the substrate S.

Reduction and oxidization electrochemical reactions of constituents of the surface of substrate S are also envisaged, in which case it is not necessary for the electrolyte E to contain an electrochemically active species.

The method according to the second aspect of the invention further comprises an emission step S2 to emit uniform light radiation onto said surface of the substrate S, so as to activate said surface, and a polarization step S3 of said surface at an electric potential allowing the envisaged electrochemical reaction to be carried out.

The light radiation emitted during step S2 is chosen in relation to the type of substrate S.

Advantageously, for forced reactions, the light radiation has sufficient energy to populate the conduction band of the semiconductor material.

Therefore, the light radiation advantageously has energy at least equal to the gap of the semiconductor. For example, regarding a substrate in silicon, the light radiation advantageously has energy at least equal to 1.12 eV.

The polarizing step S3 can be conducted in potentio- or galvano-pulsed mode for a determined time.

The uniformity of the electrochemical reaction on the surface of the substrate S can only be obtained under particular electric potential application conditions and particular light radiation conditions during step S2, achieved via the above-described different embodiments of the device according to the first aspect of the invention.

In particular, the uniformity of reaction highly depends on the uniformity of illumination of the surface of substrate S, and on the intensity of the illumination.

For some electrochemical reactions leaving a trace on the surface of the substrate S, the uniformity of the reaction can be quantified a posteriori.

This is the case in particular for deposit reactions of an organic or metallic film on the surface of a substrate S. In this case, analysis of the uniformity of the deposited film translates the uniformity of the electrochemical reaction which permitted this deposit.

Figure 11A:
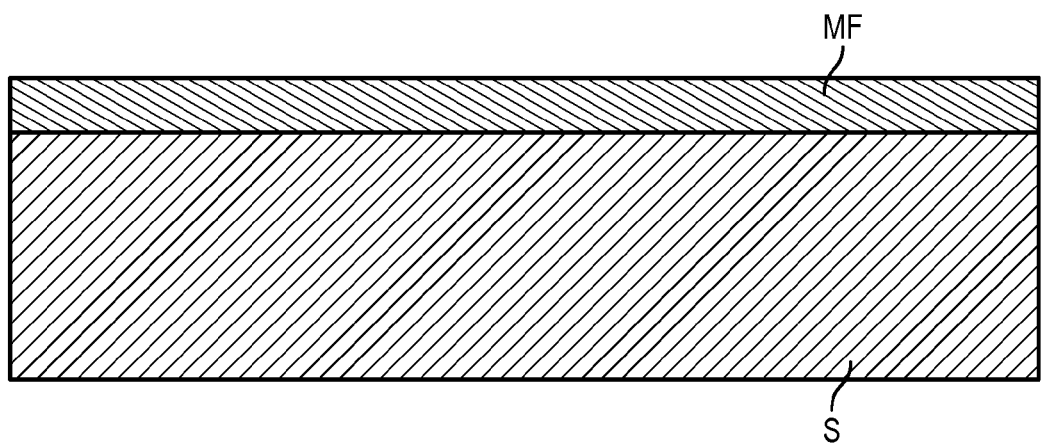
FIGS. 11a and 11b are front-view cross-sectional schematics of semiconductor substrates coated with film according to the third and fourth aspects of the invention.

Therefore, the electrolyte E advantageously comprises a metallic electrochemical species and the electrochemical reaction leads to formation of a metallic film MF on the surface of the substrate S as shown in FIG. 11a.

It is then possible to measure the electric uniformity of the MF film, for example using a four-point square method to measure electric resistance, well known to the person skilled in the art.

The substrate S according to the third aspect of the invention is coated with a metallic film having electric uniformity, measured at 1 sigma, of at least 6%.

Figure 11B:
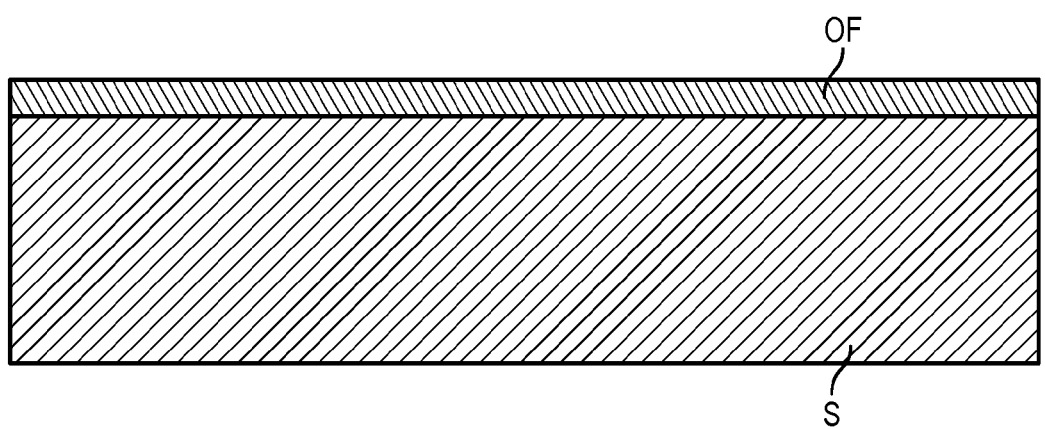

Alternatively, or accumulatively, the electrolyte E may contain an organic electrochemical species, and the electrochemical reaction leads to the formation of an organic film OF on the surface of the substrate S as illustrated in FIG. 11b.

The uniform thickness of the organic film can then be measured, for example using an ellipsometry method well known to the person skilled in the art.

The substrate S according to the fourth aspect of the invention is coated with an organic film whose uniformity of thickness, measured at 1 sigma, is at least 6%.

The method of the invention is advantageously performed for the deposit of an electrically insulating organic film, having uniform thickness, over the surface of a substrate S.

As a non-limiting example, for the purpose of said reaction, the electrolyte E advantageously contains:
 a protogenic solvent;
 at least one diazonium salt;
 at least one chain polymerisable monomer and soluble in said protogenic solvent;
 at least one acid in sufficient quantity to stabilize said diazonium salt by pH adjustment of said solution to a value of less than 7, preferably less than 2.5.

Advantageously, the protogenic solvent used in the above-cited example is chosen from the group consisting of water, preferably de-ionized or distilled; hydroxylated solvents, in particular alcohols with 1 to 4 carbon atoms; carboxylic acids having 2 to 4 carbon atoms, in particular formic acid and acetic acid and their mixtures.

In general, numerous diazonium salts can be used to implement the method according to the second aspect of the invention, in particular the diazonium salts cited in document WO 2007/099218.

Therefore, according to one particular characteristic, the diazonium salt is an aryl diazonium salt, chosen from among the compounds of following formula (I):

$$R-N_2^+, A^- \qquad (I)$$

in which:
 A is a monovalent anion,
 R is an aryl group.

As an example of aryl group R, particular mention can be made of aromatic or heteroaromatic carbon structures, whether non-substituted or mono- or poly-substituted, consisting of one or more aromatic or heteroaromatic cycles each containing 3 to 8 atoms, the heteroatom(s) being chosen from among N, O, S, or P; the optional substituent(s) preferably being chosen from electron attractor groups such as $NO_2$, COH, ketones, CN, $CO_2H$, $NH_2$, esters and halogens.

The R groups that are particularly preferred are the nitrophenyl and phenyl groups.

Within the above compounds of formula (I) A can particularly be chosen from among inorganic anions such as halides e.g $I^-$, $Br^-$ and $Cl^-$, halogenoboranes such as tetrafluoroborane, and organic anions such as alcoholates, carboxylates, perchlorates and sulphates.

The above-cited diazonium salt of formula (I) is chosen from among phenyldiazonium tetrafluoroborate, 4-nitrophenyldiazonium tetrafluoroborate, 4-bromophenyldiazonium tetrafluoroborate, 2-methyl-4-chlorophenyldiazonium chloride, 4-benzoylbenzenediazonium tetrafluoroborate, 4-cyanophenyldiazonium tetrafluoroborate, 4-carboxyphenyldiazonium tetrafluoroborate, 4-acetamidophenyldiazonium tetrafluoroborate, 4-phenylacetic diazonium acid tetrafluoroborate, 2-methyl-4-[(2-methylphenyl)-diazenyl]benzenediazonium sulphate, 9,10-dioxo-9,10-dihydro-1-anthracenediazonium chloride, 4-nitrophtalenediazonium tetrafluoroborate, and naphtalenediazonium tetrafluoroborate, 4-aminophenyldiazonium chloride.

Preferably, the diazonium salt is chosen from among phenyldiazonium tetrafluoroborate and 4-nitrophenyl-diazonium tetrafluoroborate.

The diazonium salt is generally present in the electrolyte E in a quantity of between $10^{-3}$ and $10^{-1}$ M, preferably between $5.10^{-3}$ and $3.10^{-2}$ M. In general, the electrolyte E may contain a chain polymerisable monomer that is soluble in the protogenic solvent. By "soluble in a protogenic solvent" here is meant any monomer or mixture of monomers whose solubility in the protogenic solvent is at least 0.5 M.

These monomers are advantageously chosen from among vinyl monomers soluble in the protogenic solvent and meeting the following general formula (II):

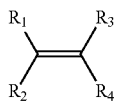

(II)

in which the groups $R_1$ to $R_4$, the same or different, are a non-metallic monovalent atom such as a halogen atom or hydrogen atom, or a saturated or unsaturated chemical group such as a $C_1$-$C_6$ alkyl group, aryl group, a —$COOR_5$ group in which $R_5$ is a hydrogen atom, or a $C_1$-$C_6$ alkyl group, nitrile, carbonyl, amine or amide.

Preferably, water-soluble monomers are used. Said monomers are advantageously chosen from among ethylene monomers comprising pyridine groups such as 4-vinylpyridine or 2-vinylpyridine, or from among ethylene monomers comprising carboxylic groups such as acrylic acid methacrylic acid, itaconic acid, maleic acid, fumaric acid and their sodium, potassium, ammonium or amine salts, the amides of these carboxylic acids and in particular the acrylamide and the methacrylamide and their N-substituted derivatives, their esters such as 2-hydroxyethyl methacrylate, glycidyl methacrylate, the dimethyl or diethyl amino (ethyl or propyl) (meth)acrylate and their salts, the quaternized derivatives of these cationic esters such as acryloxyethyl trimethylammonium chloride, 2-acrylamido-2-methylpropane sulphonic acid (AMPS), vinylsulphonic acid, vinylphosphoric acid, vinyllactic acid and their salts, acrylonitrile, N-vinylpyrrolidone, vinyl acetate, N-vinylimidazoline and its derivatives, N-vinylimidazole and the derivatives of diallylammonium type such as dimethyldiallylammonium chloride, dimethyldiallylammonium bromide, diethyldiallylammonium chloride. The quantitative composition of the electrolyte E may vary within broad limits.

In general, the electrolyte E contains:
at least 0.3 M of polymerisable monomer(s),
at least $5.10^{-3}$ M of diazonium salt(s), the molar ratio between the polymerisable monomer(s) and the diazonium salt(s) lying between 10 and 300.

Generally the polarization during step S2 of the surface of the substrate S, to be coated with the electric insulating film, is conducted in pulsed mode of which each cycle is characterized by:
a total period P of between 10 ms and 2 s, preferably in the order of 0.6 s;
a polarization time $T_{on}$ of between 0.01 and 1 s, preferably in the order of 0.36 s during which a potential difference or a current is imposed on the surface of the substrate; and
a rest time, with zero potential or current, lasting between 0.01 and 1 s, preferably in the order of 0.24 s.

For reasons of clarity, the invention has been described with respect to light illumination of the surface of the substrate. The reader will appreciate that the invention such as described and claimed is not limited to this application and extends to any radiation adapted to activate or catalyze an electrochemical reaction on the surface of a substrate.

In particular the illumination means 50 can be substituted by any means to emit uniform radiation, that is not necessarily light radiation, onto the surface of the substrate S.

The radiations envisaged under the invention are chosen by their wavelength in relation to the gap of the semiconductor material.

Examples of application of the invention will now be described, with respect to organic film deposit reactions whose uniformity of thickness has been measured.

In the examples, the terms "film" or "layer" are indifferently used to designate a film deposited on the surface of a substrate S by implementing the method according to the second aspect of the invention.

EXAMPLE 1

Preparation of a Poly-4-Vinylpyridine (P4VP) Film on a Substrate of Planar Wafer Type 200 mm in P-Doped Silicon (Known Per Se) Illuminated at Between 3,000 lux and 3,500 lux.

Substrate:
The substrate S used in this example is a disc of P-doped silicon, 200 mm in diameter and with a thickness of 750 μm and resistivity of 50 Ω·cm.

Electrolyte:
The electrolyte E used in this example is an aqueous solution prepared by adding 195 ml of 4-vinylpyridine (4-VP; 1.83 mol) to 2.8 L of 1.5 M HCl, then adding to this mixture 4.95 g of 4-nitrobenzene diazonium tetrafluoroborate (DNO2; $2.10^{-2}$ mol) which forms the electrochemically active species.

Device:
The device used to prepare the P4VP film is the device according to the first aspect of the invention illustrated in FIG. 1 in which:
the container 10 is a parallelepiped tank of size 30 cm×30 cm×10 cm,
the support 20 is in Teflon,
the counter-electrode 30 is a rectangular anode in graphite of size 20 cm×5 cm×2 mm,
the light source 51 is a halogen lamp of power 150 W placed in front of the substrate, so as to obtain maximum light intensity on the surface of S. The lamp is positioned for this purpose at a distance of around 35 cm from the surface of S,
the means 52 to homogenize the light rays consist of a light diffusing shield placed at a distance of about 5 cm from the source 51, with illumination measured at between 3,000 lux and 3,500 lux on the surface of the substrate S.

The illumination was measured after attaching the substrate S to the support 20, before filling the container 10 with the electrolyte E.

Figure 12A:
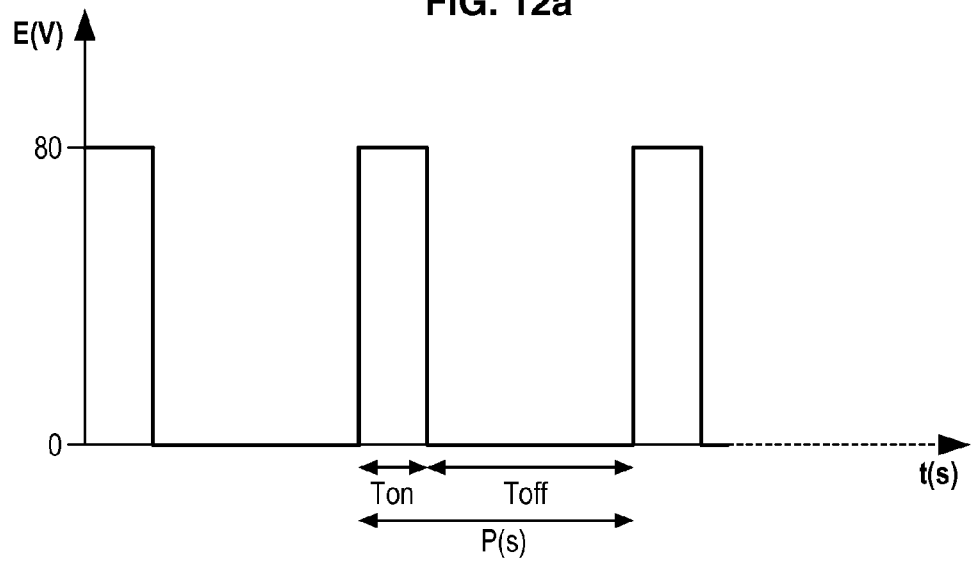
FIGS. 12a and 12b are diagrams of electrochemical polarizing protocols for the substrate S followed in the examples of application of the method according to the second aspect of the invention.

Protocol:
The protocol to prepare the P4VP film includes the following steps:
contacting, S1, the substrate S with the electrolyte E, in the container 10
emitting, S2, uniform light radiation onto the surface of the substrate S.
polarizing, S3, the surface of the substrate S following the electrochemical protocol defined below, illustrated in FIG. 12a and comprising:
a period P of 70 ms
a polarization time $T_{on}$ of 10 ms during which an electric potential difference E(V) of between 50 V and 80 V (80 V in the example) is applied between the anode and the substrate S, and
a rest time with E(V)=0 V denoted $T_{off}$ for a time of 60 ms.

The electrochemical protocol was conducted in potentio-pulsed mode for a time of 20 minutes.

In general, the duration of the electrochemical protocol, as will be appreciated, depends on the desired thickness of the insulating polymer layer. This duration can readily be determined by the person skilled in the art, the growth of the layer being a function of the charge applied to the substrate S.

When the desired thickness is reached, the substrate S and the support 20 are removed from the device, the assembly being rinsed several times in water and dimethylformamide (DMF) before drying under a stream of nitrogen.

Under the above-described conditions, a P4VP layer was obtained having a thickness of between 140 nm and 180 nm.

Characterizations:

Analysis by ellipsometry allowed determination of uniformity of thickness of the P4VP layer deposited on the surface of the substrate S. Measurements were taken at 49 points, stopping at 10 mm from the edge of the substrate S.

The results obtained were:
mean thickness 160 nm,
maximum thickness 180 nm,
minimum thickness 140 nm,
Uniformity of the P4VP layer measured at 1 sigma: 3.7%.

EXAMPLE 2

Preparation of a Poly-4-Vinylpyridine (P4VP) Film on a 200 mm Planar Wafer in P-Doped Silicon, Illuminated at Between 4,000 lux and 4,500 lux Substrate:
The substrate S used is described in Example 1.
Electrolyte:
The electrolyte E used in this example is the one described in Example 1.
Device:
The device used to prepare the P4VP film is the device according to the first aspect of the invention illustrated in FIG. 1 in which:
the container 10 is a parallelepiped tank of size 30 cm×30 cm×10 cm,
the support 20 is in Teflon,
the counter-electrode 30 is a rectangular anode in graphite of size 20 cm×5 cm×2 mm,
the light source 51 is a halogen lamp of 150 W power placed in front of the substrate S so as to obtain maximum light intensity on the surface of S. For this purpose, the lamp is positioned at a distance of about 30 cm from the surface of S.
the means 52 to homogenize the light rays consist of a light diffusing shield placed at a distance of about 5 cm from the source 51, with illumination measured at between 4,000 lux and 4,500 lux on the surface of the substrate S, and
Protocol:
The protocol to prepare the P4VP film is described in Example 1.

Under the above-described conditions, a P4VP layer was obtained having a thickness of between 160 nm and 210 nm.

Characterizations:
Analysis by ellipsometry allowed determination of the uniformity of thickness of the P4VP layer deposited on the surface of the substrate S. The measurements were taken at 49 points stopping at 10 mm from the edge of the substrate S.

The results obtained were:
mean thickness 190 nm,
maximum thickness 210 nm,
minimum thickness 160 nm, uniformity of the P4VP layer measured at 1 sigma: 5%.

EXAMPLE 3

Preparation of a Poly-4-Vinylpyridine (P4VP) Film on a 200 mm Planar Wafer in P-Doped Silicon Illuminated at Between 7,000 lux and 8,000 Lux Substrate:
The substrate S used was the one described in Example 1.
Electrolyte:
The electrolyte E used in this example is the one described in Example 1.
Device:
The device used to prepare the P4VP film is the device according to the first aspect of the invention illustrated in FIG. 1 in which:
the container 10 is a parallelepiped tank of size 30 cm×30 cm×10 cm,
the support 20 is in Teflon,
the counter-electrode 30 is a rectangular anode in graphite of size 20 cm×5 cm×2 mm,
the light source 51 is a halogen lamp of 150 W power placed in front of the substrate S so as to obtain maximum light intensity on the surface of S. The lamp is positioned for this purpose at a distance of about 35 cm from the surface of S and the illumination measured on the surface of the substrate lies between 7,000 lux and 8,000 lux.
Protocol:
The protocol to prepare the P4VP film is described in Example 1.

Under the above-described conditions, a P4VP layer was obtained having a thickness of between 120 nm and 370 nm.

Characterizations:
Analysis by ellipsometry allowed determination of the uniformity of thickness of the P4VP layer deposited on the surface of the substrate S. The measurements were taken at 49 points, stopping at 10 mm from the edge of the substrate S.

The results obtained were:
mean thickness 230 nm,
maximum thickness 370 nm,
minimum thickness 120 nm,
uniformity of the P4VP layer measured at 1 sigma: 27%.

EXAMPLE 4

Preparation of a Poly-4-Vinylpyridine (P4VP) Film on a 200 mm Planar Wafer in P-Doped Silicon, Illuminated at Between 12,000 lux and 15,000 lux Substrate:
The substrate S used was the one described in Example 1.
Electrolyte:
The electrolyte E used in this example was the one described in Example 1.
Device:
The device used to prepare the P4VP film is the device according to the first aspect of the invention illustrated in FIG. 1 in which:
the container 10 is a parallelepiped tank of size 30 cm×30 cm×10 cm,
the support 20 is in Teflon,
the counter-electrode 30 is a rectangular anode in graphite of size 20 cm×5 cm×2 mm, the light source 51 is a halogen lamp of 500 W power placed in front of the substrate S so as to obtain maximum light intensity on the surface of S. For this purpose, the lamp is positioned at a distance of about 80 cm from the surface of S and the illumination measured on the surface of the substrate lies between 12,000 lux and 15,000 lux.

Protocol:

The protocol to prepare the P4VP film is described in Example 1.

Under the above-described conditions, a P4VP layer was obtained having a thickness of between 90 nm and 550 nm.

Characterizations:

Analysis by ellipsometry allowed determination of the uniformity of thickness of the P4VP layer deposited on the surface of the substrate S. The measurements were taken at 49 points, stopping at 10 mm from the edge of the substrate S. The results obtained were:
 mean thickness 260 nm,
 maximum thickness 550 nm,
 minimum thickness 90 nm,
 uniformity of the P4VP layer measured at 1 sigma: 55%.

EXAMPLE 5

Preparation of a Poly-4-Vinylpyridine (P4VP) Film on a Planar 50 mm Wafer in P-Doped Silicon (Known Per Se) Illuminated at Between 2,500 lux and 3,000 lux.

Substrate:

The substrate S used in this example is a disc of P-doped silicon 50 mm in diameter having a thickness of 750 µm and resistivity of 50 Ω·cm.

Electrolyte:

The electrolyte E used in this example is an aqueous solution prepared by adding 19.5 ml of 4-vinylpyridine (4-VP; 0.183 mol) to 280 ml of 1.5 M HCl, then adding to this mixture 0.495 g of 4-nitrobenzene diazonium tetrafluoroborate (DNO2; $2.10^{-3}$ mol) which forms the electrochemically active species.

Device:

The device used to prepare the P4VP film is the device according to the first aspect of the invention in which:
 the container 10 is a cylindrical tank of size 12 cm in diameter×5 cm in height,
 the support 20, which can be set in rotation, is in Teflon,
 the counter-electrode 30 is a rectangular anode in graphite of size 5 cm×2 cm×2 mm,
 the light source 51 is a halogen lamp of 75 W power placed in front of the substrate S so as to obtain maximum light intensity on the surface of S. For this purpose, the lamp is positioned at a distance of about 12 cm from the surface of S,
 the means 52 to homogenize the light rays consist of a light diffusing shield placed at a distance of about 5 cm from the source 51, with illumination measured at between 2,500 lux and 3,000 lux on the surface of the substrate S.

Figure 12B:
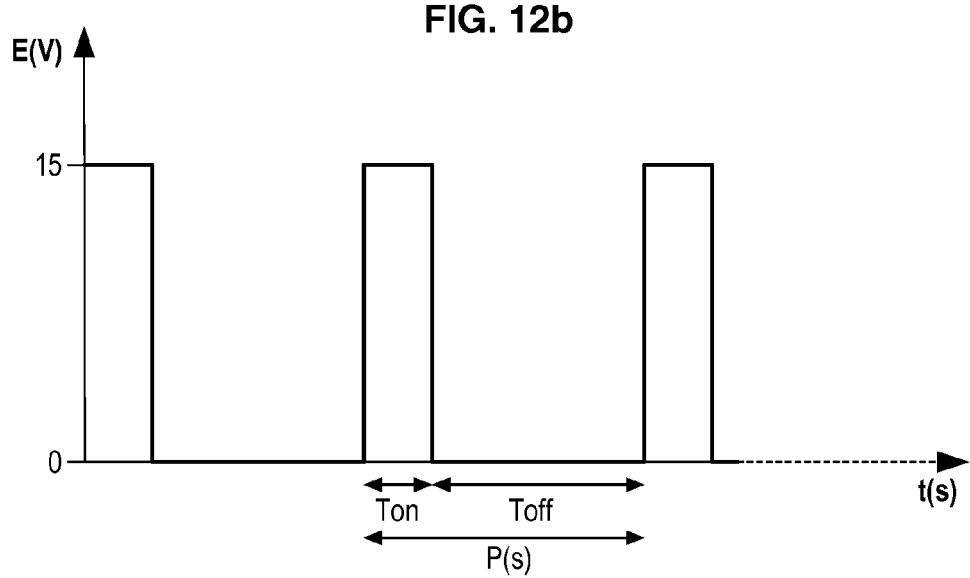

Protocol:

The protocol to prepare the P4VP film includes the following steps:
 contacting S1 the semiconductor substrate S with the electrolyte E, in the container 10,
 emitting S2 uniform light radiation onto the surface of the substrate S,
 polarizing S3 the surface of the substrate S following the electrochemical protocol defined below, illustrated in FIG. 12b and comprising:
  a period P of 70 ms
  a polarization time $T_{on}$ of 10 ms during which a difference in electric potential E(V) of between 10 V and 20 V (15 V in the example) is applied between the anode and the substrate S, and
  a rest time with E(V)=0 V denoted $T_{off}$ of duration 60 ms.

The electrochemical protocol was applied in potentiopulsed mode for a time of 20 minutes.

The support 20, on which the substrate S is attached, is set in rotation at a speed of 50 rpm (radians per minute) for the entire duration of the electrochemical protocol S3.

The duration of the electrochemical protocol, as will be appreciated, depends on the desired thickness of the polymer insulating layer. This duration can readily be determined by the person skilled in the art, growth of the layer being a function of the charge applied to the substrate S.

When the desired thickness is reached, the substrate S and the support 20 are removed from the device, the assembly being rinsed several times in water and dimethylformamide (DMF) before drying under a stream of nitrogen.

Under the above-described conditions, a P4VP layer was obtained having a thickness of between 284 nm and 300 nm.

Characterizations:

Analysis by ellipsometry permitted determination of the uniformity of thickness of the P4VP layer deposited on the surface of the substrate S. The measurements were taken at 9 points, stopping at 6 mm from the edge of the substrate S.

The results obtained were:
 mean thickness 286 nm,
 maximum thickness 300 nm,
 minimum thickness 284 nm, uniformity of the P4VP layer measured at 1 sigma: 3%.

The invention claimed is:

1. A device to conduct an electrochemical reaction on a surface of a semiconductor substrate (S), characterized in that the device comprises:
 a container (10) intended to contain an electrolyte (E);
 a support (20) arranged in the container (10), said support (20) being adapted for attachment of the semiconductor substrate (S) onto said support (20);
 a counter-electrode (30) arranged in the container (10), the counter-electrode (30) being ring-shaped and having a central opening;
 illumination means (50) arranged in the container (10) and positioned co-axially with and coplanar with the central opening of the counter-electrode (30), said illumination means (50) comprising:
  (i) a light source (51) emitting light rays, the light source (51) being arranged relative to the counter-electrode (30) such that emitted light rays travel substantially through the central opening of the counter-electrode (30); and
  (ii) a light diffusing shield (52) to homogenize the emitted light rays on all of said surface of said semiconductor substrate (S) so as to activate said surface; and
 an electric power supply (40) comprising connection means for connection to the semiconductor substrate (S) and to the counter-electrode (30) in order to polarize said surface of said semiconductor substrate (S) at an electric potential permitting the electrochemical reaction.

2. The device of claim 1, wherein the container (10) and the support (20) are adapted to receive a disc-shaped substrate (S) of a given diameter being between 50 mm and 450 mm.

3. The device of claim 1, wherein the container (10) comprises at least one reflective inner wall reflecting the light radiation from the illumination means (50).

4. The device of claim 1, wherein the counter-electrode (30) has symmetry about an axis of symmetry, the container (10) and the support (20) being adapted to receive a semiconductor substrate having a symmetry about an axis, the support (20) being adapted for attachment of the semiconductor substrate so that the axis of symmetry of the semiconductor substrate is aligned with the axis of symmetry of the counter-electrode.

5. The device of claim 1, wherein the support (20) is arranged in a mobile fashion in the container (10) to allow rotation of the semiconductor substrate (S) for further homogenization of the light rays on said surface of the semiconductor substrate (S).

6. The device of claim 1, further comprising an hydrodynamic diffuser (70) comprising two faces, said hydrodynamic diffuser (70) being arranged in the container (10) with a first face facing the counter-electrode (30), the support (20) being adapted for attachment of the substrate (S) to face the second face of the hydrodynamic diffuser (70).

7. The device of claim 6, wherein the hydrodynamic diffuser (70) is formed in a material transparent to the light radiation from the illumination means (50).

8. The device of claim 1, wherein at least a portion of the counter-electrode (30) is arranged between the illumination means (50) and the support (20).

9. The device of claim 1, wherein the illumination means (50) further comprise a plurality of light sources (53) arranged in the container (10) to emit light radiation distributed homogeneously on the surface of the semiconductor substrate (S).

10. The device of claim 9, wherein the illumination means (50) further comprise a structure comprising a surface having a central opening, the counter-electrode (30) being arranged co-axially to the central opening, the light sources (53) being distributed over the surface of the structure on the periphery of the central opening of the structure.

11. A method to conduct an electrochemical reaction on a surface of a semiconductor substrate, characterized in that the method comprises the steps of:
provingy an electrolyte (E) in a container, said container including a ring-shaped counter-electrode (30) having a central opening;
contacting the semiconductor substrate (S) with the electrolyte (E);
emitting, via illumination means (50) arranged in the container and positioned co-axially with and coplanar with the central opening of the counter-electrode (30), a light radiation in the direction of said surface of the semiconductor substrate (S) and substantially through the central opening of the counter-electrode (30);
homogenizing, via a light diffusing shield (52), the light radiation emitted on all of said surface of the semiconductor substrate (S) so as to activate the surface of the semiconductor substrate (S); and
polarizing said surface of said semiconductor substrate (S) at an electric potential permitting the electrochemical reaction.

12. The method of claim 11, wherein the electrolyte (E) contains an electrochemically active species, and wherein the electrochemical reaction involves said species.

13. The method of claim 11, wherein the species is metallic, so that the electrochemical reaction leads to the formation of a metallic film (MF) on the surface of the substrate (S).

14. The method of claim 12, wherein the species is organic so that the electrochemical reaction leads to the formation of an organic film (OF) on the surface of the substrate (S).

15. The method of claim 12, wherein a substrate (S) is used that is disc-shaped having a given diameter of between 50 mm and 450 mm.

* * * * *

UNITED STATES PATENT AND TRADEMARK OFFICE
CERTIFICATE OF CORRECTION

PATENT NO. : 8,795,503 B2
APPLICATION NO. : 13/256824
DATED : August 5, 2014
INVENTOR(S) : Zahraoui et al.

It is certified that error appears in the above-identified patent and that said Letters Patent is hereby corrected as shown below:

In the claims:

Column 20,
Line 27, "claim 11" should read --claim 12--;
Line 33, "claim 12" should read --claim 11--.

Signed and Sealed this
Third Day of February, 2015

Michelle K. Lee
*Deputy Director of the United States Patent and Trademark Office*